（12）United States Patent
Heigelmayer et al.

(10) Patent No.: US 7,109,796 B2
(45) Date of Patent: Sep. 19, 2006

(54) AMPLIFYING CIRCUIT WITH ADJUSTABLE AMPLIFICATION AND TRANSMITTER SYSTEM COMPRISING SUCH AN AMPLIFYING CIRCUIT

(75) Inventors: Bernhard Heigelmayer, Linz (AT); Harald Pretl, Schwertberg (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/033,088

(22) Filed: Jan. 10, 2005

(65) Prior Publication Data

US 2005/0174175 A1 Aug. 11, 2005

Related U.S. Application Data

(63) Continuation of application No. PCT/DE03/02286, filed on Jul. 8, 2003.

(30) Foreign Application Priority Data

Jul. 10, 2002 (DE) ................ 102 31 181

(51) Int. Cl.
 *H03F 3/45* (2006.01)
(52) U.S. Cl. .............. 330/254; 330/257; 330/311
(58) Field of Classification Search ............ None
 See application file for complete search history.

(56) References Cited

U.S. PATENT DOCUMENTS

| 5,216,384 | A | * | 6/1993 | Vanhecke | ............ 330/279 |
| 5,926,068 | A | | 7/1999 | Harr | |
| 5,977,828 | A | * | 11/1999 | Hu et al. | ............ 330/254 |
| 5,999,044 | A | * | 12/1999 | Wohlfarth et al. | ............ 330/254 |
| 6,049,252 | A | * | 4/2000 | Iwata | ............ 330/254 |
| 6,181,206 | B1 | | 1/2001 | Palmisano et al. | |
| 6,373,337 | B1 | | 4/2002 | Ganser | |
| 6,819,720 | B1 | * | 11/2004 | Willetts | ............ 330/149 |

FOREIGN PATENT DOCUMENTS

| EP | 0 810 723 A1 | 12/1997 |
| WO | WO 01/41302 A1 | 6/2001 |

OTHER PUBLICATIONS

"The Design of CMOS Radio-Frequency Integrated Circuits", T. H. Lee, Cambridge University Press, 1998, pp. 235-237.
"RF Microelectronics", B. Razavi, Prentice Hall, 1998, pp. 2-7.
"Analysis and Design of Analog Integrated Circuits", P. R. Gray et al., John Wiley and Sons, 1993, pp. 377-378 and 511-513.
"Bipolar and MOS Analog Integrated Circuit Design", A. B. Grebene, John Wiley and Sons, 1984, pp. 444-448.
"International Search Report", Int. Appl. No. PCT/DE03/02286 Int. Filing Date Jul. 8, 2003.

* cited by examiner

*Primary Examiner*—Khanh Van Nguyen
(74) *Attorney, Agent, or Firm*—Eschweiler & Associates, LLC

(57) ABSTRACT

The invention is directed to an amplifier circuit with adjustable gain which includes a plurality of parallel-connected differential amplifiers connected to a common cascode stage. An actuation unit is used to activate the differential amplifiers independently of one another on the basis of an applied control signal. The principle described makes it possible to dispense with inductances in the differential amplifier and hence to reduce unwanted crosstalk, while having a high linearity. Secondly, the amplifier's drawn current matches the respective output power which can be tapped off. Overall, the principle described is particularly suitable for use in UMTS mobile radios.

17 Claims, 5 Drawing Sheets

AMPLIFYING CIRCUIT WITH ADJUSTABLE AMPLIFICATION AND TRANSMITTER SYSTEM COMPRISING SUCH AN AMPLIFYING CIRCUIT

REFERENCE TO RELATED APPLICATION

This application is a continuation of PCT/DE03/02286, which was not published in English, that claims the benefit of the priority date of German Patent Application No. DE 102 31 181.1, filed on Jul. 10, 2002, the contents of which are herein incorporated by reference in their entirety.

FIELD OF THE INVENTION

The present invention relates to an amplifier circuit with adjustable gain and to a transmission arrangement with the amplifier circuit.

BACKGROUND OF THE INVENTION

In radio-frequency engineering, "RF power amplifiers" are normally used on the output side in the transmission path. In the case of third-generation mobile radios, for example, which are designed for UMTS (Universal Mobile Telecommunications Standard), "W-CDMA" (Wide-Band Code Division Multiple Access) signals with a bandwidth of two megahertz need to be amplified over an exponential characteristic curve on a carrier-frequency level of approximately 2 Ghz. An exponential transfer characteristic of this type is typical of variable gain amplifiers (VGAs) and can be plotted as a straight line in a semilogarithmic representation. In this case, the output power in decibels is normally plotted over the control voltage of the amplifier in volts.

Adjustable radio-frequency amplifiers of this type are subject to great demands in terms of current drawn, efficiency, linearity, noise and chip area requirement. The latter demand results in problems with crosstalk, and in radio-frequency engineering, particularly in unwanted breakthrough of carrier frequencies, self-mixing effects etc. The current drawn normally needs to be small because such mobile radios are normally powered from batteries or storage batteries.

Power amplifiers in the radio-frequency range are normally in the form of inductively degenerated differential amplifiers which are designed using bipolar circuitry and have a connected current cascode.

A differential amplifier of this type is specified, by way of example, in the document P. R. Gray, R. G. Meyer "Analysis and Design of Analog Integrated Circuits", John Wiley and Sons, 1993, pages 377 to 378 and 511 to 513, cf. FIG. 5–10 therein, for example. This differential amplifier can be used to advantage, particularly with respect to the high gain, the high cut-off frequencies, low inherent noise and good linearity on account of the inductive degeneration. In this case, the output of the cascode stage is normally in the form of an open collector output in integrated transmission circuits. As a load resistor, a surface acoustic wave filter is normally connected to a power amplifier stage of this type, which represents the nonreactive load thereof. This serves to suppress unwanted signal components. Any adaptive network which may be required at the output of the open collector output is normally connected externally in this case.

The inductive degeneration of the differential amplifier with inductances connected between the common emitter node of the amplifier and the emitter connections of the two differential amplifier transistors brings about the negative current feedback which is wanted, said negative current feedback giving rise to just low inherent noise in the overall system when the quality is high and allowing the transfer function to be linearized.

When amplifying radio-frequency signals, however, the inductance disadvantageously acts as an antenna or transformer, particularly in the GHz range, and thus presents an unavoidable problem as regards the crosstalk of signals through the alternating electromagnetic field on the integrated circuit onto other circuits. A further problem is regulation of the power output from the amplifier. For the gain A, it holds true that A is proportional to the product of $g_{m,red}$ and $R_{load}$, where $g_{m,red}$ represents the transconductance of the common-emitter differential amplifier transistors. $R_{load}$ is the load resistance connected to the open collector output. In this case, the gain of the cascode stage has been assumed to be one. The gradient is essentially determined by the collector current and the value of the emitter degeneration in the relevant radio-frequency range, in line with the following rule:

$$g_{m,red} \approx \frac{1}{\frac{1}{g_m} + Z_L} \approx \frac{1}{\frac{U_T}{I_C} + Z_L}$$

where $g_m$ is the gradient, $Z_L$ is the complex degeneration resistance, $I_C$ is the collector current and $U_T$ is the voltage equivalent of thermal energy.

It can be seen that the power output from the amplifier can be controlled only by intervening in the latter's supply of quiescent current, which would disadvantageously shift the amplifier's operating point accordingly. With a relatively large gain range, however, this would bring about unwanted nonlinearities in the differential amplifier.

The document A. B. Grebene "Bipolar and MOS Analog Integrated Circuit Design", John Wiley and Sons 1984, pages 444 to 448, illustrates a developed amplifier with a current shunting principle in the cascode stage. In this case, two cascode stages are connected in parallel (cf. FIG. 8.37 therein, for example) which change over the current signal from the amplifier smoothly from the output to the supply voltage. This is possible if an additional control block is used to shift the bias potentials of the cascode transistors linearly. As a result, $$I_C = I_S \cdot \exp\left(\frac{U_{BE}}{U_T}\right)$$

results in an exponential characteristic curve from the amplifier for regulation which is linear in a semi-logarithmic representation. The most serious drawback of power regulation of this type is provided by the constant current drawn by the power amplifier. A power-saving mode can be provided only by using a not insignificant amount of auxiliary power for the control block. The amplifier itself requires a constant power at every point of the characteristic curve, which significantly reduces the efficiency of the overall circuit when the output power is brought down.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present one or more concepts of the invention in a simplified form as a prelude to the more detailed description that is presented later.

The present invention is directed to an amplifier with adjustable gain which is suitable for amplifying radio-frequency signals and which has a large adjustable gain range, operates in a current-saving fashion and prevents unwanted crosstalk from signals.

In one embodiment of the invention, an amplifier circuit with an adjustable gain comprises an input terminal pair for supplying a differential signal, an output for deriving an amplified signal, and a control input for supplying a gain factor. The amplifier circuit further comprises a cascode stage which is connected to the output and comprises two cascode transistors coupled to one another on the control side, and a plurality of differential amplifiers connected in parallel, with a respective input which is connected to the input terminal pair, with a respective output which is connected to the cascode stage, and with a respective activation input. The amplifier also includes an actuation unit, with an input which is connected to the control input of the amplifier circuit, and with a plurality of outputs, a respective one of which is connected to the activation input of a respective differential amplifier for the purpose of activating one or more differential amplifiers on the basis of the gain factor supplied at the control input. The activation input associated with a differential amplifier is coupled to a current mirror transistor which forms a respective current mirror together with two amplifier transistors in the differential amplifier in order to supply a reference current on the basis of a signal applied to the activation input.

The parallel-connected differential amplifier stages, which have a similar circuit design to one another, have their outputs connected to one another and are connected to a common cascode stage.

In one example, each individual amplifier cell operates at an operating point which has been set in optimum fashion in terms of linearity and noise. The differential amplifiers can be connected and disconnected independently of one another. Each differential amplifier cell which has been turned on makes its contribution to the total gain. These contributions, which are preferably in the form of current components, are added at the input of the cascode stage and are transferred to the output of the cascode stage and hence to the output of the amplifier circuit with adjustable gain. The individual differential amplifiers are actuated by means of the actuation unit, which uses a predetermined allocation rule to map the control signal at the input, for example an input voltage, onto an arbitrary characteristic curve.

In one example, the control voltage is mapped onto an exponential power characteristic curve by appropriately connecting and disconnecting individual differential amplifiers. Efficient utilization of current in the power regulation is achieved by virtue of a particular point on a characteristic curve only having as many differential amplifier cells turned on as are needed to provide a desired output power. This ensures that the present amplifier circuit performs in terms of noise, linearity, distortion and efficiency over the entire gain range.

The individual differential amplifiers connected in parallel preferably have the same circuit design.

The design described for the amplifier circuit with a plurality of differential amplifier stages connected in parallel which feed a common cascode stage makes it possible to dispense with the use of inductances for inductive degeneration in the individual differential amplifier cells without any drawbacks. The circuit of the present invention is thus suitable for larger scales of integration at frequencies in the gigahertz range, since problems as a result of crosstalk are significantly reduced.

The actuation unit is connected to the activation inputs of the parallel-connected differential amplifiers via a current mirror, in one example, with a negative-feedback resistor or bias resistor which feeds the control inputs of the differential amplifier transistors. In this arrangement, the control inputs of the differential amplifier transistors are connected via a respective resistor to a common node in the current mirror and operate as output transistors for the current mirror.

The radio-frequency signal to be amplified is preferably supplied by means of an AC coupling element produced by series capacitors.

The differential amplifier is preferably designed as a common-source circuit, that is to say that the source or emitter connections of the differential amplifier transistors are connected to one another.

The operating point is preferably set using the bias resistors and the current mirror. Hence, the operation of the current sources and the operation of the amplifier coincide in the two differential amplifier transistors, which means that the output signal has a large modulation range.

The amplifier transistors are preferably in the form of field effect transistors. The cascode transistors, which form a common cascode stage for all of the differential amplifiers are preferably produced using bipolar circuitry.

Using bipolar circuitry for the cascode transistors also significantly improves the linearity characteristics of the amplifier. The low impedance at the emitter inputs of the cascode transistors means that the voltage swing on the drain connections of the amplifier transistors is largely suppressed, and the current signal itself does not produce its voltage swing on a load which is to be connected until at the high-impedance collector output of the cascode.

The activation input of the individual differential amplifiers is preferably actuated by a respective associated comparator which is provided in the actuation unit. The comparators are supplied at one respective input with the nominal signal having the desired gain of the amplifier circuit and at a respective other input with a respective, graduated threshold value. These comparison voltages or comparison signals are preferably graduated exponentially and are provided, by way of example, by a resistor chain which forms a voltage divider.

The comparators are preferably produced using bipolar circuitry. As a result, the differential amplifiers are turned on in line with a hyperbolic tangent characteristic curve, resulting in a particularly gentle transition along the desired output characteristic curve with a moderate gradient. This precludes, in particular, disadvantageous effects on superordinate control loops which may contain the present amplifier circuit.

Instead of the exponentially graduated threshold values as comparison potentials for the comparators, it is also possible to use a linear graduation for the threshold values and to alter the weighting of the gain contributions by the individual differential amplifier cells accordingly, so that an exponential characteristic curve for the amplifier likewise results overall.

In general, the principle presented may be used to generate any desired characteristic curve, for example logarithmic, linear or exponential, for the output power as a function of the control voltage.

The present amplifier is particularly suitable for use in mobile radio transmitters with direct conversion of baseband to the radio-frequency level and is provided for use in equipment based on UMTS (Universal Mobile Telecommunications Standard) which operates using code division multiple access (CDMA).

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

The invention is explained in more detail below using exemplary embodiments with reference to a plurality of drawings, in which.

DETAILED DESCRIPTION OF THE INVENTION

Figure 1:
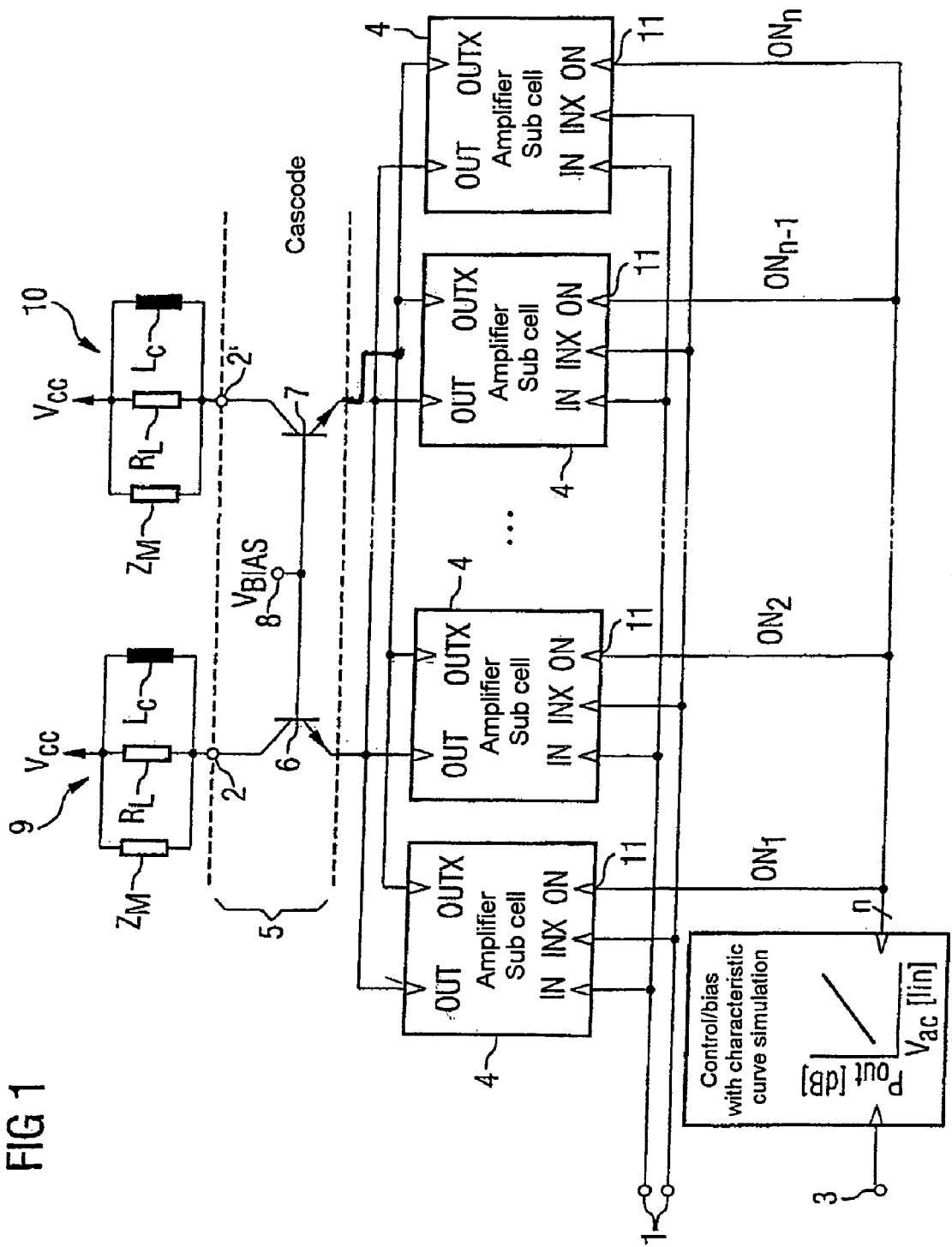
FIG. 1 is a block diagram illustrating an amplifier circuit according to an exemplary embodiment of the present invention.

FIG. 1 shows an amplifier circuit with an adjustable gain value. This circuit has a useful-signal input 1 for supplying a differential useful signal which is in the form of an input terminal pair. The amplified useful signal can be derived at the output terminal pair 2, 2' of the amplifier. A control input 3 may be used to supply a nominal signal for a desired gain value for the amplifier as a voltage signal. A plurality of differential amplifiers 4 connected to one another in a parallel circuit are connected to the input 1 by their respective input terminal pairs. Their output terminal pairs, which are likewise of differential design and are connected to one another, have a common cascode stage 5 connected to them which comprise two cascode transistors 6, 7. The cascode transistors 6, 7 are produced using bipolar circuitry and have their base connections connected to one another and to a bias voltage input 8. The emitter output pair is connected to the output terminal pairs of the differential amplifiers 4. The collector connection pair of the npn transistors 6, 7 forms the output terminal pair 2, 2' of the amplifier. The amplifier output 2, 2' has external, electrical loads 9, 10 connected to it. The external, electrical loads 9, 10 are respectively in the form of parallel circuits comprising a resistive load $R_L$, a complex load $Z_M$ and an inductance $L_C$, by way of example and in simplified representation. Besides their input terminal pair and their output terminal pair, which are respectively connected to one another in parallel, the differential amplifiers 4 also have a respective activation input 11. The activation inputs 11 of the differential amplifiers 4 are connected to a respective associated output on an actuation unit 12 whose input side is connected to the control input 3 and which takes an applied control signal as a basis for activating one or more of the differential amplifier cells 4 which can be connected and disconnected from one another separately.

Each differential amplifier cell 4 processes the same input signal at the cell's optimum operating point in terms of linearity and noise and makes its contribution to the total gain. These current contributions are added at the low-impedance input of the cascode 5 and are converted to power in the off-chip load resistors 9, 10. The individual differential amplifier cells 4 are actuated by means of the actuation unit 12, which uses a predetermined allocation rule to map, in the general case, an input-side control signal onto an arbitrary characteristic curve, in the present case an exponential power characteristic curve. In this context, the differential amplifiers 4 are activated by means of their supply of quiescent current (bias).

The amplifier circuit described affords a large adjustable gain range, good noise characteristics and good linearity characteristics in terms of distortion. In addition, the current requirement matches the present power output at all times on the basis of the design shown. Since it is thus possible to dispense with inductive degeneration in the individual differential amplifiers 4, the crosstalk is also low and the radio-frequency characteristics are good in the gigahertz range.

Figure 2:
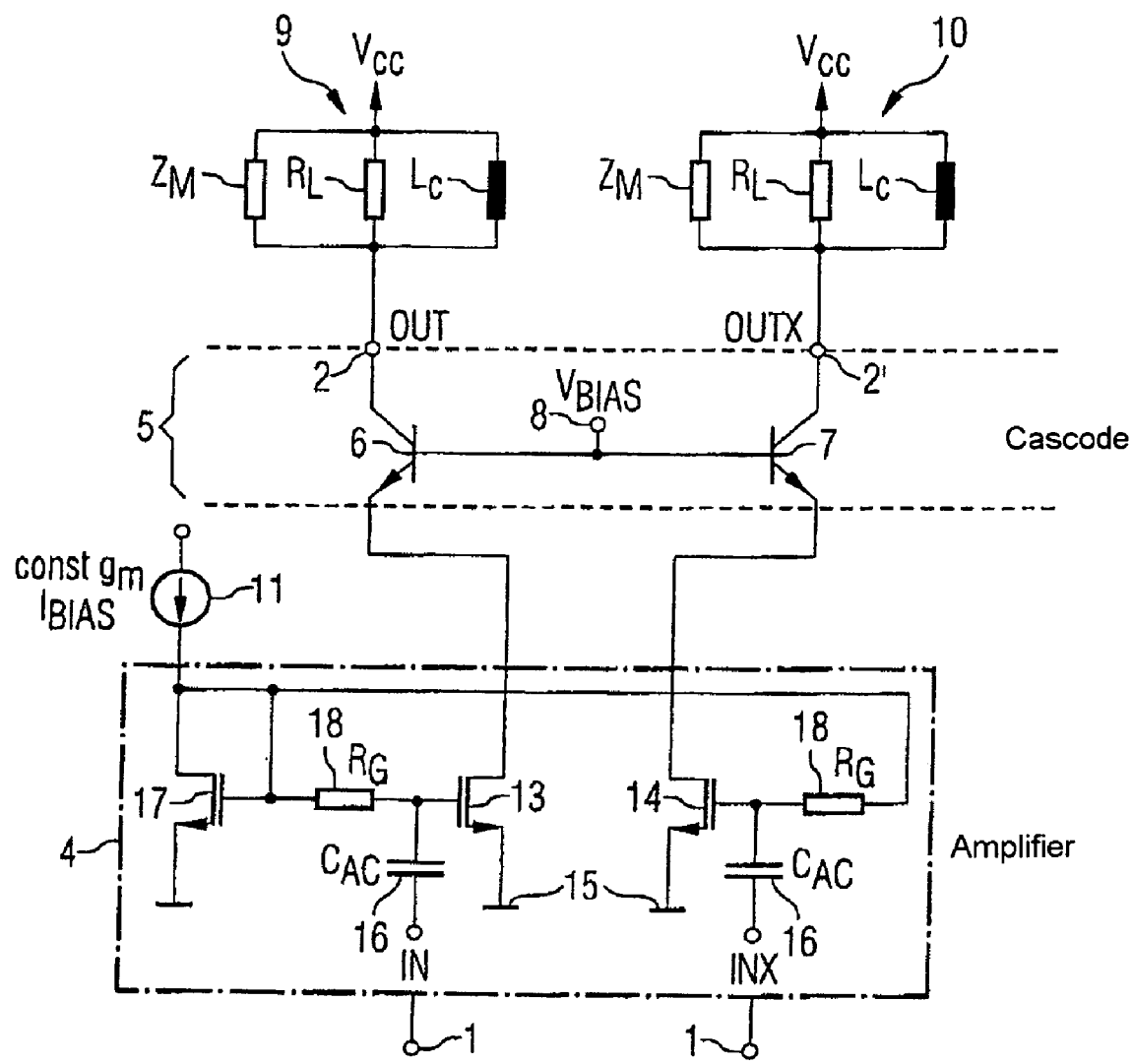
FIG. 2 is a circuit diagram illustrating an exemplary form of the amplifier cells of FIG. 1.

FIG. 2 shows a circuit design of the differential amplifier cells 4 in accordance with one exemplary embodiment of the invention. These differential amplifier cells 4 from FIG. 1 all have the same circuit design. The actual differential amplifier is formed from two n-channel MOS field effect transistors 13, 14 whose drain connections are connected to a respective emitter connection on the cascode transistors 6, 7 and whose source connections are connected to the reference potential connection 15. The gate connections of the differential amplifier transistors 13, 14 are connected to the useful-signal input 1 via series coupling capacitances 16 which provide high-pass filter characteristics. In addition, for the purpose of setting the operating point, a current mirror is provided which has a current mirror transistor 17, which is likewise in the form of an n-channel field effect transistor and is connected up as a diode. The gate connection of the current mirror transistor 17 is connected to the two gate connections of the differential amplifier transistors 13, 14 via a respective bias resistor 18. The drain connection of the current mirror transistor 17, which is connected to the gate connection thereof, forms the activation input 11 of the differential amplifier 4.

As in FIG. 1, the external electrical load comprises a coil $L_C$, which is needed for the output voltage to oscillate about the operating voltage VCC, a nonreactive load resistor $R_L$, which represents the surface acoustic wave bandpass filter connected downstream of the amplifier, and a complex load $Z_M$ which represents an adaptive network.

It can be seen that the differential amplifiers 4 advantageously require no inductances.

The radio-frequency useful signal to be amplified is supplied via the coupling capacitances 16 and modulates the amplifier 13, 14 operated in common-source mode. The amplifier's operating point is set using the current mirror transistor 17 and the resistors 18. Advantageously, the operations of the current source and of the amplifier coincide in the transistors 13, 14, which has an advantageous effect on the modulation range of the output signal, in particular. The adequate linearity of the amplifier is ensured by virtue of an adequate overdrive voltage having been set on the transistors 13, 14. This ensures that the signal current and the quiescent current are in a ratio of less than 1 during operation. The low impedance at the emitter input of the cascode transistors 6, 7 largely suppresses the voltage swing on the drain connections of the amplifier transistors 13,14. The current signal itself does not produce its voltage swing on the electrical load 9, 10 until at the high-impedance collector output of the cascode stage 6, 7.

So that the desired gain may be guaranteed over the entire temperature range of use, a quiescent current signal with constant $g_m$ is used, said signal being provided by the actuation circuit 12. In the differential amplifier circuit 4, the constant gradient value $g_m$ required for a constant output power is set using a resistance value and is fixed through the use of a regulator.

Figure 3:
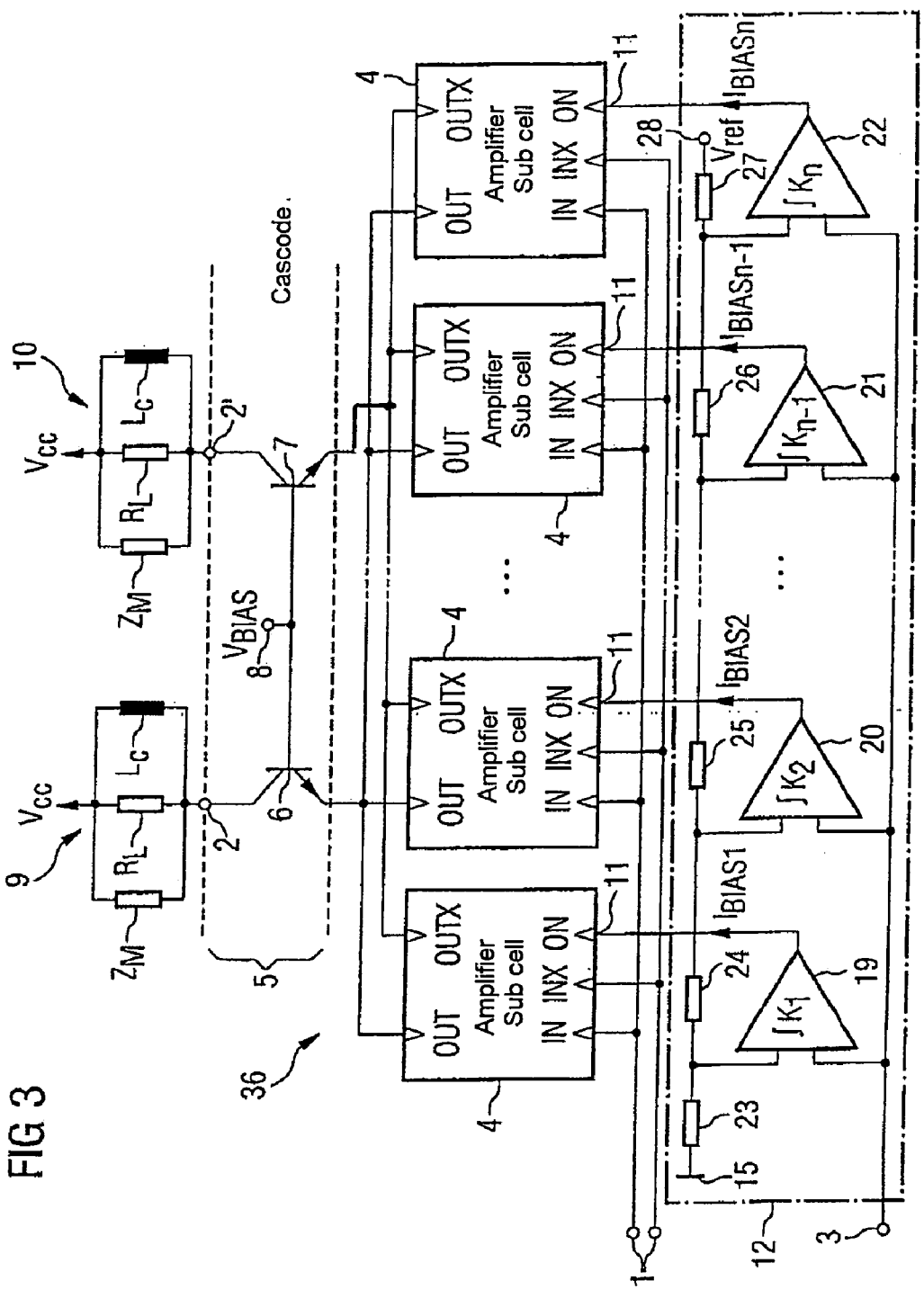
FIG. 3 is a block diagram illustrating a development of the amplifier circuit of FIG. 1 with comparators for actuating the differential amplifiers.

FIG. 3 shows an amplifier circuit with adjustable gain of FIG. 1, with the actuation circuit 12 for the differential amplifiers 4 being shown in detail using an exemplary embodiment. All other components, the way in which they work, their interconnection and the advantageous way in which the amplifier circuit works as a whole are equivalent to those in FIG. 1 and are therefore not repeated again at this point.

The actuation circuit 12 comprises comparators, a respective one of which is associated with a respective differential amplifier 4. The comparators have been provided with reference symbols 19 to 22. The comparators 19 to 22 have a respective output which is connected to the activation input 11 of the associated differential amplifier 4 for the purpose of supplying a quiescent current which activates the respective differential amplifier 4. The comparators 19 to 22 each have two inputs. A respective first input of the comparators 19 to 22 is connected to the control input 3 of the amplifier, which is used to set the gain value of the amplifier. The second inputs of the comparators 19 to 22 are connected to a respective tap node in a resistor chain 23 to 27 which is connected between the reference potential 15 and a supply potential connection 28. The resistors 23 to 27 are graduated exponentially in terms of their values, which means that exponentially graduated threshold value potentials for the comparators 19 to 22 are provided at the tap nodes. Hence, the exponential behavior of the amplifier with the advantages already explained in detail is provided.

Figure 4:
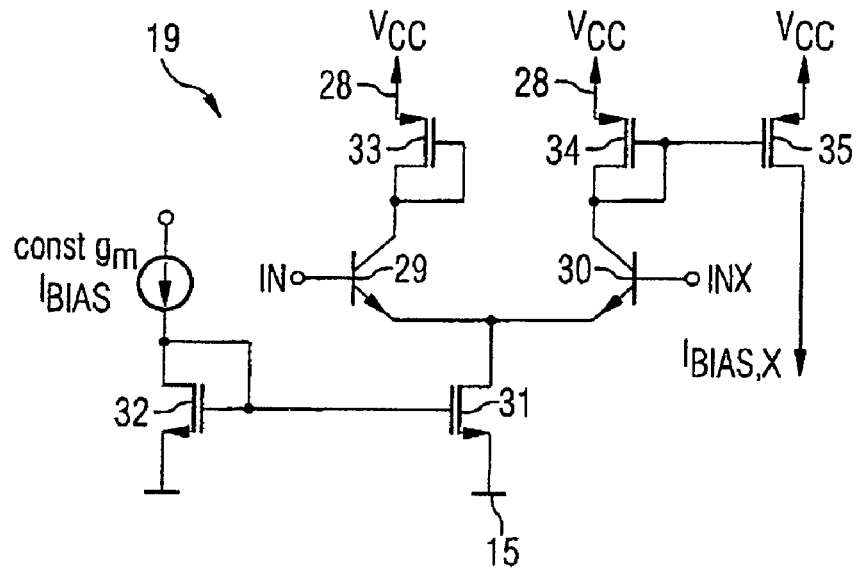
FIG. 4 is a circuit diagram illustrating an exemplary form of a comparator of FIG. 3.

FIG. 4 uses a detailed circuit diagram to show the comparator 19 from FIG. 3. The comparators 20 to 22 in FIG. 3 also have the same design as that shown in FIG. 4. The core of the comparator 19 comprises two npn bipolar transistors which are connected as differential transistors 29, 30 for the comparator and are connected to one another by their emitters. The common emitter node is connected to reference potential 15 via an n-channel field effect transistor 31 operating as a current source. The current source transistor 31 and a transistor 32 connected up as a diode form a current mirror whose input is supplied with a quiescent current which brings about a constant $g_m$ value in the amplifier transistors. The collectors of the differential transistors 29, 30 in the comparator 19 are connected to supply potential connection 28 via a respective diode 33, 34. In this arrangement, one of the two diodes is used to output the output signal from the comparator 29, 30 via a current mirror formed by a further MOS transistor 35 together with the diode 34. The drain connection of the current mirror transistor 35 is connected to an activation input 11 on a differential amplifier 4 (not shown here) in order to activate the latter, as shown in FIG. 3.

On account of the use of bipolar circuitry in the core of the comparator 19 and of the other comparators 20 to 22, the differential amplifiers 4 are activated in line with a hyperbolic tangent characteristic curve, which advantageously results in a particularly gentle transition along the desired output characteristic curve with a moderate gradient for the gain characteristic curve.

Figure 5:
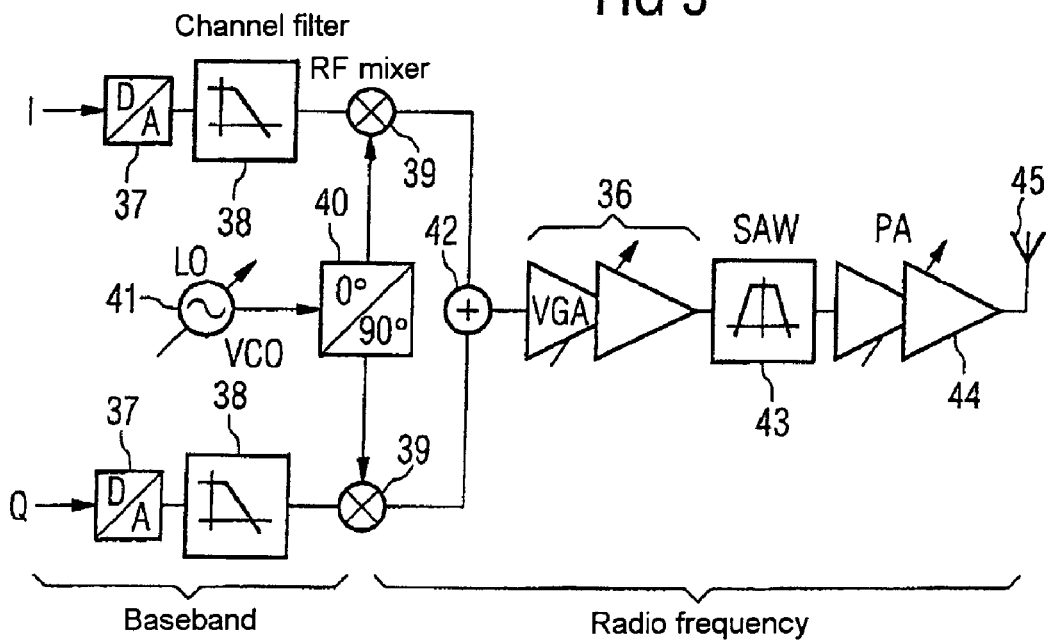
FIG. 5 is a block diagram illustrating a transmission path with the amplifier circuit of FIG. 1 or 3.

FIG. 5 shows an exemplary application of the amplifier circuit with adjustable gain 36 from FIG. 3 in the transmission path of a mobile radio. In the present case, this is a direct converter with complex-value signal processing whose baseband unit contains an in phase path and a quadrature path I, Q for the complex-value signal processing of a complex useful signal split into orthogonal components. The I and Q paths comprise a respective digital/analog converter 37 with a downstream low-pass filter 38, said filters being connected to a respective first input on a mixer cell 39 in a quadrature mixer. The respective second inputs of the mixer cells 39 are connected via a 0/90-degree phase shifter 40 to an adjustable frequency generator 41 which generates a local oscillator signal. The quadrature mixer further comprises a summing element 42 which connects the mixer cells 39 to one another at their outputs. The output of the quadrature mixer 39, 40, 42 accordingly provides a modulated carrier signal at a radio-frequency level. Depending on the desired transmission power or depending on nominal values in control loops, this signal is amplified as desired in the amplifier circuit 36 with adjustable gain and is bandpass-filtered in a downstream surface acoustic wave filter 43. The output of the bandpass filter 43 is connected to a transmission antenna 45 via a power amplifier 44.

The advantages of the present amplifier, such as high linearity, low distortion, a high level of integratability with low crosstalk and low drawn current matched to the present power output, are effective to particular advantage in a direct converter of this type.

Figure 6:
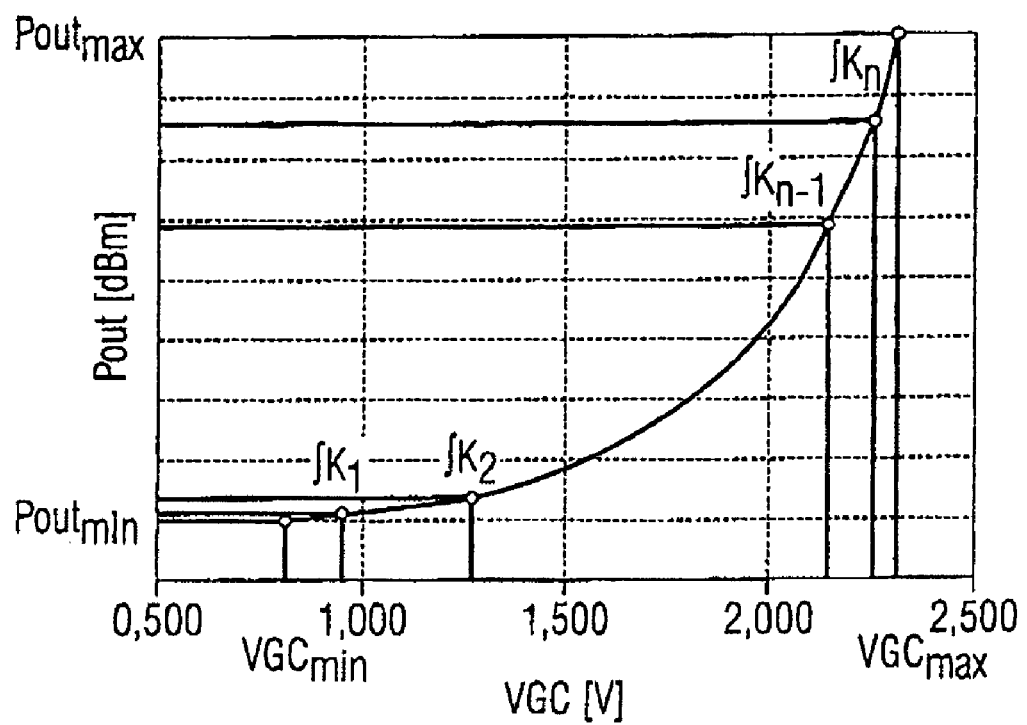
FIG. 6 is a graph illustrating the characteristic curve for the output voltage plotted over the control voltage in linear representation in accordance with the amplifier circuit from FIG. 3.

FIG. 6 is a linear graph illustrating the output power of the amplifier of FIG. 3 in mW plotted against the voltage value of the control signal applied to the control input 3. The changeover thresholds of the individual comparators 19, 22 and the desired exponential profile of the characteristic curve can clearly be seen. Accuracy of the exponential function of the characteristic curve can be seen even more clearly from the next drawing.

Figure 7:
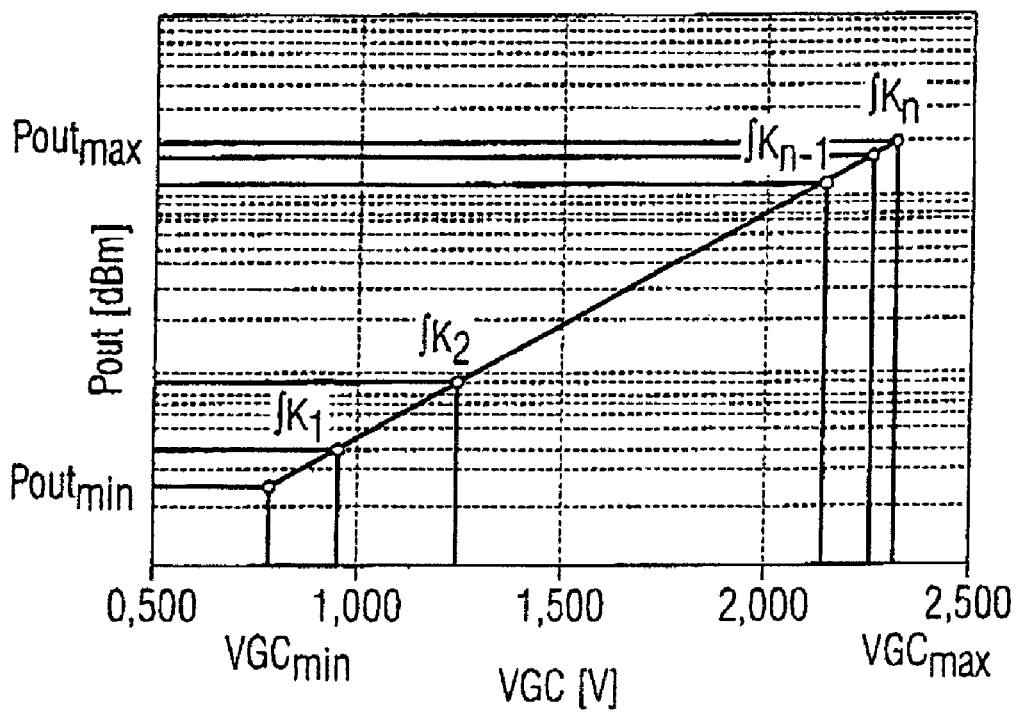
FIG. 7 is a graph illustrating the characteristic curve of FIG. 6, but in a semi-logarithmic representation.

FIG. 7 is a log graph illustrating the characteristic curve profile from FIG. 6, but plotted in a semi-logarithmic format. In this case, the output power in dBmW is plotted against the control voltage in volts. The result is a linear relationship between the control voltage and the output power in dB, plotted using a straight line. The representation in FIG. 7 also shows the changeover thresholds of the individual comparators which activate the differential amplifiers 4.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The invention claimed is:

1. An amplifier circuit with adjustable gain, comprising:
  an in put terminal pair configured to receive a differential input signal;
  an output configured to output an amplified version of the differential input signal;
  a control input configured to supply a gain factor to the amplifier circuit;
  a cascode stage connected to the output and comprising two cascode transistors coupled together at a control terminal thereof;
  a plurality of differential amplifiers connected together in parallel, each comprising a respective differential input connected to the input terminal pair, a respective differential output connected to the cascode stage, and a respective activation input, and wherein each differential amplifier further comprises two differential amplifier transistors coupled to a current mirror transistor, and wherein the current mirror transistor is coupled to the activation input and, together with the differential amplifier transistors, is configured to supply a reference current based on a signal at the activation input; and
  an actuation unit comprising an input connected to the control input of the amplifier circuit, and a plurality of outputs, a respective one of which is connected to the activation input of a respective differential amplifier, and configured to selectively activate one or more differential amplifiers based on the gain factor supplied at the control input.

2. The amplifier circuit as claimed in claim 1, wherein the respective two differential amplifier transistors in the differential amplifiers each comprise a signal input terminal and a controlled section, and wherein the signal input terminals of the differential amplifiers are coupled to the input terminal pair of the amplifier circuit, and the controlled sections each couple an associated cascode transistor of the cascode stage to a reference potential connection.

3. The amplifier circuit of claim 1, wherein the differential amplifier transistors comprise field effect transistors, and the cascode transistors of the cascode stage comprise bipolar transistors.

4. The amplifier circuit of claim 1, wherein the actuation unit comprises a plurality of comparators, a respective one of which comprises an output connected to the activation input of an associated differential amplifier, the comparators each comprising a first input coupled to the control input of the amplifier circuit, and a second input configured to supply a respective threshold value, wherein the threshold values are graduated with respect to each other.

5. The amplifier circuit of claim 4, further comprising a divider chain comprising a plurality of exponentially graduated tap nodes, a respective one of which is connected to a second input on an associated comparator in order to provide exponentially graduated threshold values.

6. The amplifier circuit of claim 4, wherein the comparators each comprise a differential amplifier with two differential transistors having control input terminals that form the inputs of the comparator, and wherein the output of the comparator is coupled to one of the two differential transistors via a current mirror.

7. The amplifier circuit of claim 6, wherein the differential transistors of the comparators comprise bipolar transistors.

8. An amplifier circuit, comprising:
  a plurality of differential amplifier circuits coupled together in parallel between a differential signal input and a differential signal output, wherein each of the differential amplifier circuits comprises an activation input, and wherein each of the differential amplifier circuits is configured to be individually activated or deactivated based on a state of an activation signal thereat, and wherein each differential amplifier circuit further comprises two differential amplifier transistors coupled to a current mirror transistor, and wherein the current mirror transistor is coupled to the activation input and, together with the differential amplifier transistors is configured to supply a reference current based on a signal at the activation input;
  a cascode stage output circuit having a differential input coupled to the differential signal output, and a differential output forming an output of the amplifier circuit; and
  an actuation unit having a control input configured to receive a control input signal indicative of a gain of the amplifier circuit, and a plurality of activation outputs respectively coupled to the activation inputs of the differential amplifier circuits, wherein the actuation unit is configured to activate a selected one or more differential amplifier circuits via a state of the activation outputs based on the control input signal.

9. The amplifier circuit of claim 8, wherein the cascode stage output circuit comprises:
  a first bipolar transistor having an emitter terminal coupled to one output of the differential signal output, a base terminal coupled to a bias potential, and a collector terminal forming one output of the amplifier circuit output; and
  a second bipolar transistor having an emitter terminal coupled to another output of the differential signal output, a base terminal coupled to the bias potential, and a collector terminal forming another output of the amplifier circuit output.

10. The amplifier circuit of claim 8, wherein the actuation unit comprises:
  a plurality of comparators, wherein each comparator comprises a first input coupled to the control input, a second input, and an output respectively forming one of the activation outputs of the actuation unit; and
  a resistive chain coupled between two reference potentials, and forming a plurality of threshold voltage tap points thereacross, wherein each of the threshold voltage tap points is respectively coupled to the second input of the plurality of comparators,
  wherein, based on the state of the control input signal, one or more of the comparators trigger based on their respective threshold voltage tap point, thereby selectively activating a corresponding one or more differential amplifier circuits.

11. The amplifier circuit of claim 10, wherein values of resistances along the resistive chain are exponentially weighted, thereby resulting in threshold voltage tap points that vary in a generally exponential manner.

12. The amplifier circuit of claim 8, wherein the differential input and differential output of the cascode stage output circuit comprises a low impedance differential input and a high impedance differential output, respectively.

13. A transmission arrangement, comprising:
a radio-frequency mixer configured to convert a baseband signal, which has been split into in-phase and quadrature components, to a radio frequency signal; and
an amplifier circuit, having an input terminal pair connected to an output of the radio-frequency mixer, and configured to amplify a radio-frequency signal at the output of the radio-frequency mixer using an adjustable gain factor, the amplifier circuit comprising:
a plurality of differential amplifier circuits coupled together in parallel between the input terminal pair and a differential signal output, wherein each of the differential amplifier circuits comprises an activation input, and wherein each of the differential amplifier circuits is configured to be individually activated or deactivated based on a state of an activation signal thereat, and wherein each differential amplifier circuit further comprises two differential amplifier transistors coupled to a current mirror transistor, and wherein the current mirror transistor is coupled to the activation input and, together with the differential amplifier transistors is configu red to supply a reference current based on a signal at the activation input;
a cascode stage output circuit having a differential input coupled to the differential signal output, and a differential output forming an output of the amplifier circuit; and
an actuation unit having a control input configured to receive a control input signal indicative of a gain of the amplifier circuit, and a plurality of activation outputs respectively coupled to the activation inputs of the differential amplifier circuits, wherein the actuation unit is configured to activate a selected one or more differential amplifier circuits via a state of the activation outputs based on the control input signal.

14. The transmission arrangement of claim 13 wherein the cascode stage output circuit comprises:
a first bipolar transistor having an emitter terminal coupled to one output of the differential signal output, a base terminal coupled to a bias potential, and a collector terminal forming one output of the amplifier circuit output; and
a second bipolar transistor having an emitter terminal coupled to another output of the differential signal output, a base terminal coupled to the bias potential, and a collector terminal forming another output of the amplifier circuit output.

15. The transmission arrangement of claim 13, wherein the actuation unit comprises:
a plurality of comparators, wherein each comparator comprises a first input coupled to the control input, a second input, and an output respectively forming one of the activation outputs of the actuation unit; and
a resistive chain coupled between two reference potentials, and forming a plurality of threshold voltage tap points thereacross, wherein each of the threshold voltage tap points is respectively coupled to the second input of the plurality of comparators,
wherein, based on the state of the control input signal, one or more of the comparators trigger based on their respective threshold voltage tap point, thereby selectively activating a corresponding one or more differential amplifier circuits.

16. The transmission arrangement of claim 15, wherein values of resistances along the resistive chain are exponentially weighted, thereby resulting in threshold voltage tap points that vary in a generally exponential manner.

17. The transmission arrangement of claim 13, wherein the differential input and differential output of the cascode stage output circuit comprises a low impedance differential input and a high impedance differential output, respectively.

* * * * *

UNITED STATES PATENT AND TRADEMARK OFFICE
CERTIFICATE OF CORRECTION

| | |
|---|---|
| PATENT NO. | : 7,109,796 B2 |
| APPLICATION NO. | : 11/033088 |
| DATED | : September 19, 2006 |
| INVENTOR(S) | : Bernhard Heigelmayer and Harald Pretl |

It is certified that error appears in the above-identified patent and that said Letters Patent is hereby corrected as shown below:

Claim 1
Column 9, line 22: Please replace the words "in put" with the word --input--.

Claim 13
Column 11, line 33: Please replace the words "configu red" with the word --configured--.

Signed and Sealed this

Twenty-seventh Day of March, 2007

JON W. DUDAS
*Director of the United States Patent and Trademark Office*